(12) United States Patent
Mori

(10) Patent No.: US 7,176,147 B2
(45) Date of Patent: Feb. 13, 2007

(54) COMBINATION INSULATOR AND ORGANIC SEMICONDUCTOR FORMED FROM SELF-ASSEMBLING BLOCK CO-POLYMERS

(75) Inventor: Kiyotaka Mori, Arlington, MA (US)

(73) Assignee: Matsushita Electric Industrial Co., Ltd., Osaka (JP)

( * ) Notice: Subject to any disclaimer, the term of this patent is extended or adjusted under 35 U.S.C. 154(b) by 94 days.

(21) Appl. No.: 11/119,860

(22) Filed: May 2, 2005

(65) Prior Publication Data

US 2005/0215067 A1 Sep. 29, 2005

Related U.S. Application Data

(62) Division of application No. 10/810,525, filed on Mar. 26, 2004, now Pat. No. 6,930,322.

(51) Int. Cl.
*H01L 21/31* (2006.01)
*H01L 21/469* (2006.01)

(52) U.S. Cl. .................. 438/778; 438/780; 438/784

(58) Field of Classification Search ........ 438/778–785; 257/40
See application file for complete search history.

(56) References Cited

U.S. PATENT DOCUMENTS

| | | | |
|---|---|---|---|
| 5,899,734 A | 5/1999 | Lee | |
| 6,391,471 B1 | 5/2002 | Hiraoka et al. | |
| 6,569,382 B1 | 5/2003 | Edman et al. | |
| 6,723,394 B1 | 4/2004 | Sirringhaus et al. | |
| 6,835,803 B1 | 12/2004 | Ho et al. | |
| 6,987,071 B1 * | 1/2006 | Bollman et al. | 438/780 |
| 7,112,615 B2 * | 9/2006 | Gleason et al. | 438/780 |
| 2002/0158342 A1 * | 10/2002 | Tuominen et al. | 257/784 |
| 2003/0118800 A1 | 6/2003 | Thomas et al. | |
| 2003/0185741 A1 | 10/2003 | Matyjaszewski et al. | |
| 2003/0185985 A1 * | 10/2003 | Bronikowski et al. | 427/258 |
| 2005/0009227 A1 | 1/2005 | Xiao et al. | |

FOREIGN PATENT DOCUMENTS

JP 2000-392411 A 3/2003

OTHER PUBLICATIONS

AIST Announces World's Thinnest Vertical-Type Double-Gate MOSFET Using Newly Discovered Process, AIST Today International Edition No. 8, pp. 10-12, 2003.
Massimo Lazzair et al., Block Copolymers as a Tool for Nanomaterial Fabrication, Advanced Materials 15, No. 19, pp. 1583-1594, Oct. 2, 2003.
Massimo Lazzari et al., "Block Copolymers as a Tool for Nanomaterial Fabrication," *Advanced Materials*, vol. 15, No. 19, Oct. 2, 2003, pp. 1583-1594.
Sam-Shajing Sun, "Design of a block copolymer solar cell," *Solar Energy Materials & Solar Cells*, vol. 79 (2003), pp. 257-264.
Paolo Coppo et al., "Investigation of the electronic properties of cyclopentadithiophene polymers and copolymers," *Mat. Res. Soc. Symp. Proc.*, vol. 771 © 2003 Materials Research Society, pp. L4.9.1-L4.9.4.

* cited by examiner

*Primary Examiner*—Cuong Nguyen
(74) *Attorney, Agent, or Firm*—RatnerPrestia

(57) ABSTRACT

A semiconductor structure including an insulator layer formed of a first polymer. The structure also includes an organic semiconductor layer formed of a second polymer. The polymers self-assemble into a well-ordered co-polymer structure with the semiconductor layer positioned adjacent the insulator layer. The structure may be an organic, thin-film semiconductor device including, without limitation, a transistor, a multi-gate transistor, a thyristor, and the like. Also disclosed is a process of manufacturing the semiconductor structure.

8 Claims, 9 Drawing Sheets

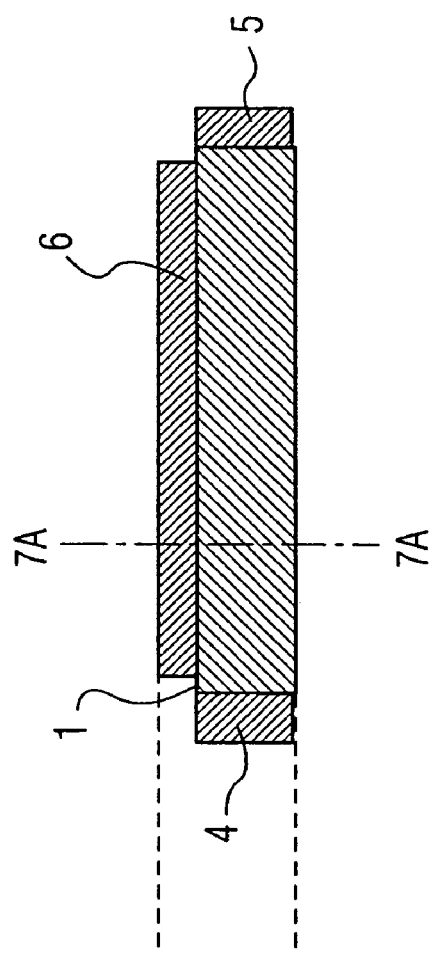
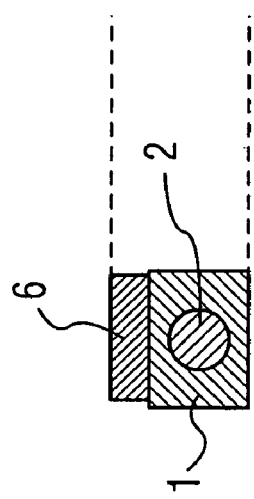
FIG. 7A
FIG. 7B

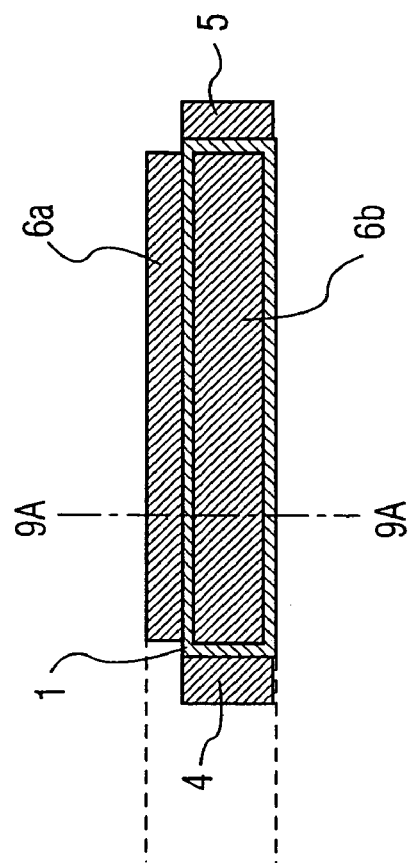
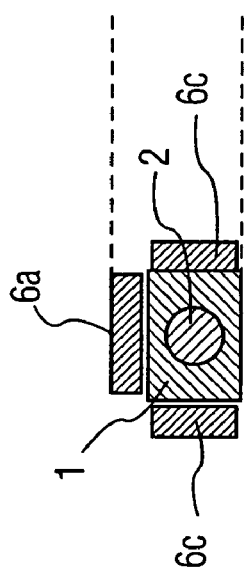
FIG. 9B
FIG. 9A

COMBINATION INSULATOR AND ORGANIC SEMICONDUCTOR FORMED FROM SELF-ASSEMBLING BLOCK CO-POLYMERS

This application is a divisional of U.S. patent application Ser. No. 10/810,525 filed Mar. 26, 2004 now U.S. Pat. No. 6,930,322, the entire disclosure of which is expressly incorporated by reference herein.

FIELD OF THE INVENTION

The present invention relates generally to organic semiconductors and, more particularly, to a combination insulator and organic semiconductor formed from self-assembling block co-polymers. Most particularly, the present invention relates to an organic, thin-film transistor.

BACKGROUND OF THE INVENTION

There are two major types of field effect transistors or FET's: the metal-oxide-semiconductor field effect transistor or MOSFET (also called an insulated-gate FET, or IGFET), and the junction-gate FET, or JFET. An FET has a control gate and source and drain regions formed in a substrate. The control gate is formed above a dielectric insulator that is deposited over the area between the source and drain regions. As voltage is applied to the control gate, mobile charged particles in the substrate form a conduction channel in the region between the source and drain regions. Once the channel forms, the transistor turns "on" and current may flow between the source and drain regions.

FIGS. 1 and 2 illustrate the structures of two main types of conventional thin-film transistors. As illustrated in FIG. 1, one type is a bottom contact structure 10. Structure 10 has a control gate electrode 6 formed above a dielectric insulator 1. Insulator 1 is formed over a semiconductor 2. In turn, semiconductor 2 is formed over a substrate 3. A source electrode 4 and a drain electrode 5 are formed in substrate 3. Gate electrode 6 is deposited over the area between source electrode 4 and drain electrode 5.

As illustrated in FIG. 2, a second type of conventional transistor is a top contact structure 20. Structure 20 has a control gate electrode 6 formed in or on the substrate 3. Insulator 1 is formed over substrate 3 and gate electrode 6. In turn, semiconductor 2 is formed over insulator 1. A source electrode 4 and a drain electrode 5 are formed on top of semiconductor 2. Gate electrode 6 is formed under the area between source electrode 4 and drain electrode 5.

Transistors are used as either amplifying or switching devices in electronic circuits. In the first application, the transistor functions to amplify small ac signals. In the second application, a small current is used to switch the transistor between an "on" state and an "off" state.

The bipolar transistor is an electronic device with two p-n junctions in close proximity. The bipolar transistor has three device regions: an emitter, a collector, and base disposed between the emitter and the collector. Ideally, the two p-n junctions (the emitter-base and collector-base junctions) are in a single layer of semiconductor material separated by a specific distance. Modulation of the current flow in one p-n junction by changing the bias of the nearby junction is called "bipolar-transistor action."

External leads can be attached to each of the three regions and external voltages and currents can be applied to the device using these leads. If the emitter and collector are doped n-type and the base is doped p-type, the device is an "npn" transistor. Alternatively, if the opposite doping configuration is used, the device is a "pnp" transistor. Because the mobility of minority carriers (i.e., electrons) in the base region of npn transistors is higher than that of holes in the base of pnp transistors, higher-frequency operation and higher-speed performances can be obtained with npn devices. Therefore, npn transistors comprise the majority of bipolar transistors used to build integrated circuits.

An insulated-gate bipolar transistor or "IGBT" is used to control the flow of electric power. It contains four regions of semiconductor material of alternate conductivity type, and it has three external terminals. The device controls the flow of power in response to a signal applied to one of its terminals, called the gate. The presence of an appropriate gate signal turns the device on and allows electric current to flow through it; removing the gate signal turns the device off, blocking the flow of current.

A "thyristor" is a semiconductor device similar to an IGBT. Like an IGBT, a thyristor contains four regions of semiconductor material of alternate conductivity type and has three external terminals, one of which is the gate. As in the IGBT, applying an appropriate gate signal turns the thyristor on, allowing the flow of electric current through it. Unlike an IGBT, however, removing the gate signal from a thyristor does not shut off the flow of electric current through the device. Once a thyristor turns on in response to the application of a gate signal, it cannot be turned off simply by removing the gate signal. The thyristor thus exhibits "latching" behavior. In response to the application of an appropriate gate signal, the device turns on and remains on even if the gate control signal is removed. Turning a thyristor off typically requires reduction of the current flowing through the device below a threshold level.

The latching property of the thyristor arises from the structure of the device. The four alternating semiconductor regions in a thyristor inherently incorporate two three-layer combinations, each of which has a forward current gain, denoted as $\sigma_1$ and $\sigma_2$, respectively. It is well known that a thyristor will not latch if the sum of $\sigma_2$ and $\sigma_2$ is less than one.

A MOSFET is also a three-terminal device that is used to control the flow of electric power. Unlike IGBT's and thyristors, however, MOSFETs have only three semiconductor regions. A MOSFET controls the flow of power through the device in response to an appropriate control signal applied to its gate terminal. MOSFETs are similar to IGBTs in that they can be used to control the flow of electric power by selectively applying and removing an appropriate gate signal. MOSFETs do not exhibit the "latching" behavior of thyristors, but thyristors can typically carry larger amounts of electric power.

IGBTs combine the controllability of a MOSFET with the high-power-carrying capabilities of a thyristor. Because they incorporate a four-layer structure similar to a thyristor, however, IGBTs incorporate two three-layer combinations of regions of alternate conductivity and therefore exhibit latching if subjected to certain electrical conditions, such as high voltages.

The semiconductor-based devices and systems described above conventionally incorporate inorganic semiconductor materials, for example, silicon-based materials. Organic semiconductors have the potential to replace conventional inorganic semiconductors in a number of applications, and further may provide additional applications to which inorganic semiconductors have not been utilized. Such applications may include, for example, display systems, mobile devices, sensor systems, computing devices, signal reception devices, signal transmission devices, and memory devices.

Replacement in these applications is anticipated because organic semiconductors have advantages when compared to conventional semiconductors. One important advantage is the relative ease of processing organic semiconductors. Another advantage is the improvement in electrical properties possible using organic semiconductors. The electrical properties of organic semiconductors depend largely on their intrinsic material properties, morphology, crystallinity, and the packing density of molecules.

More specifically, for organic thin-film transistors, the interfaces between components have played an important role. The interface between the gate insulator and the organic semiconductor determines transistor stability: the cleaner the interface, the more stable is the thin-film transistor. Currently, the organic semiconductor and the insulator layers are deposited separately by using vacuum deposition, spin coating, ink-jet printing, and the like. Therefore, the chances of contamination and imperfection at the interface are high, rendering current processes unlikely to generate a high yield of reliable devices.

In addition, the structure of the transistor plays another important role in defining the electrical properties of the device. Conventional transistor structures have a gate consisting of a gate insulator and a gate electrode located on only one side of the semiconductor. This restricts transistor properties.

The semiconductor industry has recently begun to recognize the importance of multi-gate semiconductor structures—although using conventional silicon-based materials. See, e.g., M. Masahara and E. Suzuki, "AIST Announces World's Thinnest Vertical-Type Double-Gate MOSFET Using Newly Discovered Process," AIST Today Int'l Ed. No. 8, pages 10–12 (2003) (incorporated in this document by reference). The multi-gate structure has more than one gate around the semiconductor. The structure allows optimal control of transistor properties, especially of the threshold voltage, and both minimizes power consumption and reduces switching error. More specifically, less drain current is required to turn on the device and, therefore, less power is consumed while the device is operating. In addition, each of the multiple gates can be used to control the gate threshold voltage of another gate, which allows optimal control of the threshold voltage.

The vertical-type, double-gate MOSFET considered by authors M. Masahara and E. Suzuki is designed to eliminate the short-channel effect, which is the mutual interference between the source and the drain as the distance between those components is reduced through miniaturization, by layering a thin channel between the two gates. As the authors recognize, however, fabrication of multi-gate structures has proven difficult. The authors disclose fabrication of the world's thinnest channel (about 15 nm thick) by using a conventional complementary metal-oxide-semiconductor (CMOS) production process in combination with a newly discovered process in which the etching rate of an alkaline solution is retarded at the surface exposed to ion bombardment.

To overcome the shortcomings of conventional semiconductor devices and manufacturing processes, a new device and process of manufacture are provided. An object of the present invention is to provide an improved combination insulator and organic semiconductor. A related object is to reduce the possibility of an imperfect or contaminated interface between the insulator and the organic semiconductor. Another object is to reduce the number of steps during the process of manufacturing a combination insulator and organic semiconductor.

It is still another object of the present invention to provide an organic, thin-film transistor having improved electrical properties. A related object is to provide an organic, multi-gate, thin-film transistor. More specific objects are to allow optimal control of transistor properties, especially of the threshold voltage, and to both minimize power consumption and reduce switching error. Yet another object is to provide a process facilitating the manufacture of multi-gate transistor structures.

SUMMARY OF THE INVENTION

To achieve these and other objects, and in view of its purposes, the present invention provides a semiconductor structure including an insulator layer formed of a first polymer. The structure also includes an organic semiconductor layer formed of a second polymer. The two polymers self-assemble into a well-ordered co-polymer structure with the semiconductor layer positioned adjacent the insulator layer. The structure may be an organic, thin-film semiconductor device including, without limitation, a transistor, a multi-gate transistor, a thyristor, and the like.

The present invention also provides a process of manufacturing a thin-film organic semiconductor device. The process includes, as a first step, providing a substrate. Next, an insulator layer formed of a first polymer and an organic semiconductor layer formed of a second polymer are applied to the substrate; the polymers self-assemble into a well-ordered co-polymer structure with the semiconductor layer positioned adjacent the insulator layer. Then parts of the insulator are removed between the organic semiconductor layer, thereby separating the layers of organic semiconductor.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 7A is a cross-sectional view of a single-gate transistor structure formed according to the present invention;

FIG. 7B is a side view of the single-gate transistor structure shown in FIG. 7A;

FIG. 9A is a cross-sectional view of a tri-gate transistor structure formed according to the present invention;

FIG. 9B is a side view of the tri-gate transistor structure shown in FIG. 9A;

DETAILED DESCRIPTION OF THE INVENTION

Figure 1:
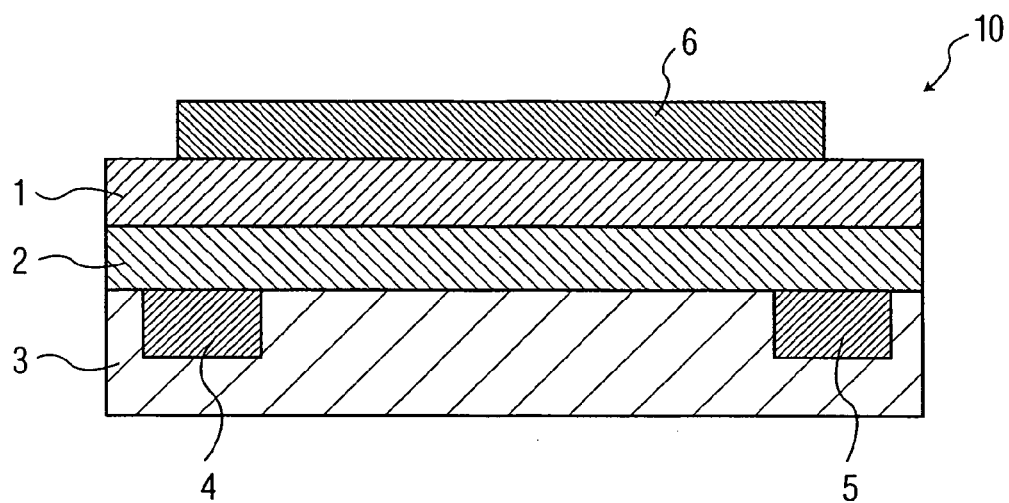
FIG. 1 illustrates a conventional bottom contact transistor structure in cross-section.

As used in this document, a polymer is a non-metallic, natural or synthetic material composed of large or small molecules formed of many repeating, linked units. A co-polymer is a mixed polymer, the product of polymerization of two or more substances at the same time. A block co-polymer is a co-polymer in which the like monomer units occur in relatively long, alternate sequences on a chain. Block co-polymers are prepared by taking advantage of special chemical or kinetic situations. The ability to synthesize a wide variety of these materials is more restricted than it is in the synthesis of random, alternating, or random-alternating-type co-polymers. Nevertheless, ingenious techniques have been devised to synthesize block co-polymers, some of wider applicability and importance than others. Two of the more important techniques are the anionic living polymer process and the free radical process.

The routes leading to block co-polymers generally involve the reaction of fresh monomer(s) with a previously prepared parent homo-polymer or co-polymer. The various sequences may be either homo-polymer or co-polymer in nature. In the special case of generating block co-polymers via the anionic living polymer technique, the parent homo-polymer is still active. For the most part, block co-polymerization involves initiating polymerization reactions through active sites bound on the parent polymer molecule. Block co-polymerization involves terminal active sites. Polymerization is usually conducted in a mixture of the parent polymer, the monomer(s) to be grown on the parent polymer, and fresh initiator.

If polymerization is conducted in a mixture of monomer, initiator, and polymer, a mixture of products may result: (1) homo-polymer of fresh monomer; (2) homo-polymer of the parent molecules that did not take part in the co-polymerization; (3) cross-links between the branched structures; and (4) the desired co-polymer. For any system having the potential to produce a high yield of the desired product, reaction conditions must be controlled so as to suppress those leading to the first three types of products and to enhance those leading to the desired co-polymer. In some instances, it may be possible to apply separation processes to obtain a pure product.

One aspect of the present invention is to use polymers to form a combination co-polymer insulator and organic semiconductor (including carbon-based nanotubes). Another aspect is to use the combination insulator and organic semiconductor structure so formed to manufacture semiconductor devices such as thin-film transistors. Co-polymers comprised of chemically distinct polymers linked together can self-assemble into well-ordered structures such as lamellas, cylinders, dots, and the like as described by M. Lazzari and M. López-Quintela, "Block Copolymers as a Tool for Nanomaterial Fabrication," 15 Advanced Materials, No. 19, pages 1583–94 (Oct. 2, 2003) (incorporated in this document by reference). By using the self-assembly of co-polymers comprised of an insulator and an organic semiconductor, the present invention improves the formation of layers of semiconductor devices and improves the structure of transistors.

Figure 3A:
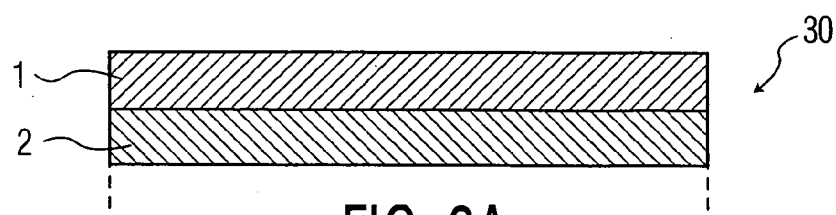
FIG. 3A is a cross-sectional view of a co-polymer lamella structure having an insulator and an organic semiconductor layered in parallel, or horizontally oriented, with the insulator on the top and the organic semiconductor on the bottom according to the present invention.
Figure 3B:
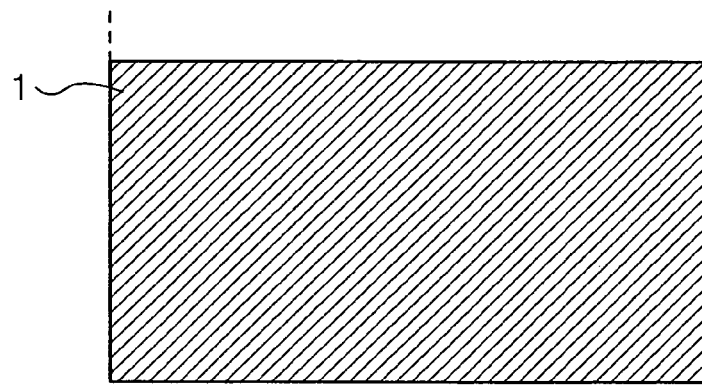
FIG. 3B is a top view of the lamella structure shown in FIG. 3A.

A. Self-Assembling Co-Polymer Combination Insulator and Organic Semiconductor Structures Referring now to the drawing, in which like reference numbers refer to like elements throughout the various figures that comprise the drawing, FIGS. 3A (cross-section) and 3B (top view) show a co-polymer lamella structure 30 formed according to the present invention. FIGS. 3A and 3B show thin-film co-polymer lamella structure 30 self-assembled from polymers comprised of the insulator 1 and the organic semiconductor 2. As best illustrated in FIG. 3A, insulator 1 and organic semiconductor 2 of lamella structure 30 are layered in parallel (i.e., the layers are horizontally oriented) with insulator 1 on the top and organic semiconductor 2 on the bottom.

By forming lamella structure 30 on a substrate 3, a thin-film transistor can be manufactured using a relatively simple process. In addition, the process minimizes the risk of forming an imperfect or contaminated interface between insulator 1 and organic semiconductor 2. Stated alternatively, the interface between insulator 1 and organic semiconductor 2 is substantially free of contamination. Substrate 3 can be various shapes including, but not necessarily limited to, a flat plate, a curved plate, a wire, a sphere, or cubes.

The formation of co-polymer lamella structure 30 from polymers is done when the polymers are heated above the glass transition temperature ($T_g$). As is well-known in the art, the properties of polymer materials vary with temperature. At sufficiently low temperatures, amorphous polymers are hard and glass-like, having a relatively high mechanical strength. This state is maintained as the temperature is raised until a critical temperature region is attained. Within this region, the polymer changes from a hard, glass-like, inflexible material to a softer, rubbery, flexible material. This drastic transition in mechanical properties is called the glass transition, and the critical temperature is called the glass transition temperature.

Once heated above $T_g$, the insulator polymer material and the organic semiconductor polymer material go into phase segregation. When the co-polymer combination is cooled down from $T_g$, the lamella structure remains and forms the two-layer structure shown in FIG. 3A. The molecular self-assembly of the block co-polymer produces, in a simple process, a useful lamella structure 30 without any direct human intervention.

Lamella structure 30 of FIGS. 3A and 3B can be used, for example, to form an improved bottom contact thin-film transistor structure similar to the conventional structure illustrated in FIG. 1. FIG. 1 shows a cross-section of bottom contact structure 10. Upon incorporation of lamella structure 30 into bottom contact structure 10, organic semiconductor 2 contacts each of substrate 3, source electrode 4, and drain electrode 5.

Figure 2:
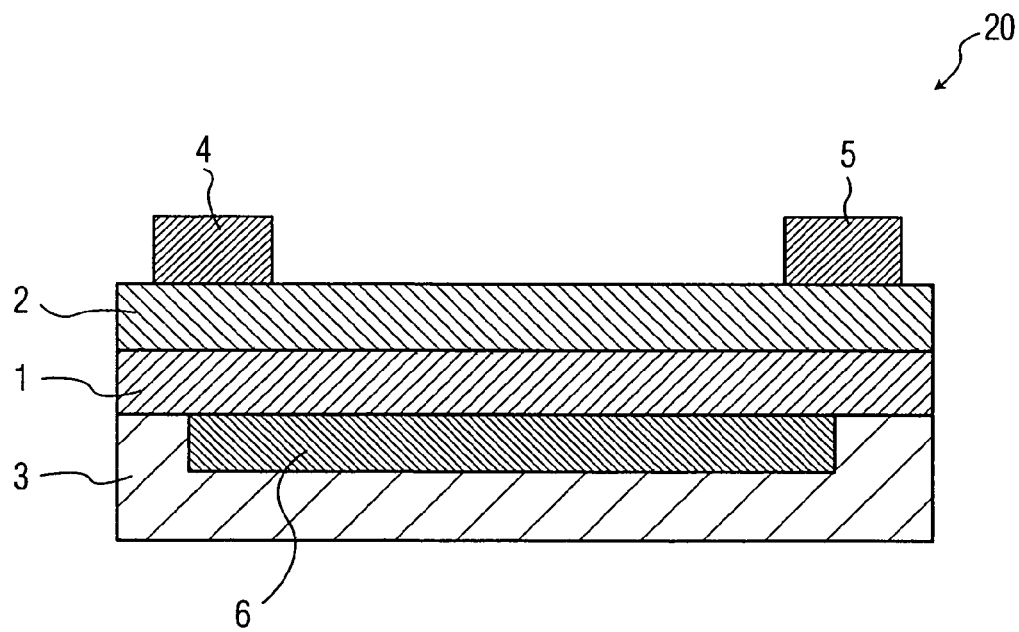
FIG. 2 illustrates a conventional top contact transistor structure in cross-section.

Of course, as would be recognized by an artisan, insulator 1 and organic semiconductor 2 of lamella structure 30 may be layered in parallel, or horizontally oriented, with insulator 1 on the bottom and organic semiconductor 2 on the top. With the order of the layers reversed relative to the order shown in FIG. 3A, lamella structure 30 can be used to form an improved top contact thin-film transistor structure similar to the conventional structure illustrated in FIG. 2. FIG. 2 shows a cross-section of top contact structure 20. Upon incorporation of reversed lamella structure 30 into top contact structure 20, insulator 1 contacts each of substrate 3 and gate electrode 6.

The process of forming lamella structure 30 can be easily controlled to yield either bottom contact structure 10 of FIG. 1 (in which semiconductor 2 contacts substrate 3) or top contact structure 20 of FIG. 2 (in which insulator 1 contacts substrate 3). One process control uses the chemical affinity between the surface of substrate 3, perhaps including electrodes 4 and 5, and either insulator 1 or organic semiconductor 2; the chemical affinity can be determined by material properties or by an altered surface treatment. Another process control uses the different densities of the two polymers that form insulator 1 and organic semiconductor 2, respectively: a denser polymer tends to sink in solution so that the lighter polymer tends to form on top of the denser polymer.

Figure 4A:
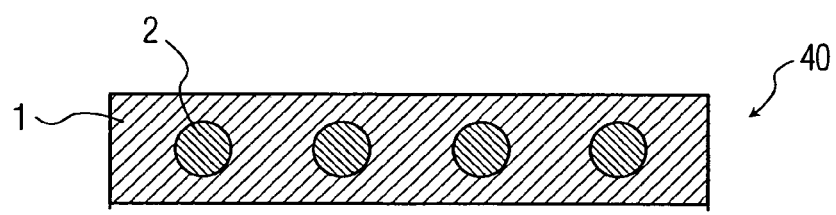
FIG. 4A is a cross-sectional view of a co-polymer cylinder structure having an insulator and an organic semiconductor layered in parallel, or horizontally oriented, with cylindrical structures of organic semiconductor surrounded in a matrix of insulator, according to the present invention.
Figure 4B:
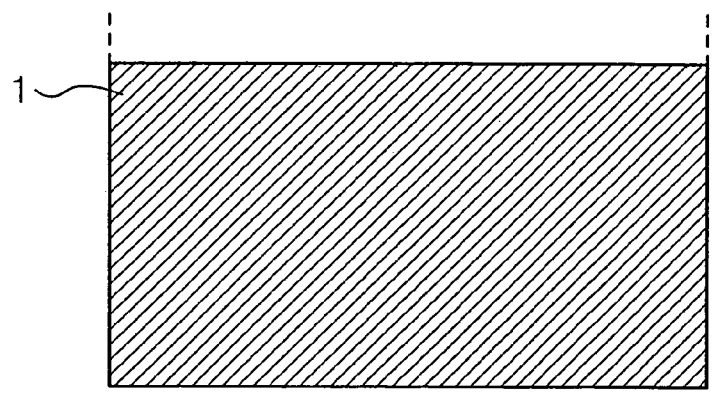
FIG. 4B is a top view of the parallel cylinder structure shown in FIG. 4A.

FIG. 4A (cross-section) and 4B (top view) show a co-polymer cylinder structure 40 formed according to the present invention. FIGS. 4A and 4B show thin-film co-polymer cylinder structure 40 self-assembled from polymers comprised of the insulator 1 and the organic semiconductor 2. As best illustrated in FIG. 4A, insulator 1 and organic semiconductor 2 of cylinder structure 40 are layered in parallel, or horizontally oriented, with cylindrical structures of organic semiconductor 2 surrounded in a matrix of insulator 1.

Parallel cylinder structure 40 can be formed using processes as outlined above, in connection with lamella structure 30, and as described in more detail by authors M. Lazzari and M. López-Quintela. As the authors note, polymers represent ideal nanoscale tools given their intrinsic dimensions, ease of synthesis and processing, strict control of architecture, chemical functionality, and unique mesophase separation both in bulk and in solution—particularly in the case of block co-polymers. Parallel cylinder structure 40 of FIGS. 4A and 4B can be used, for example, to form an improved multi-gate thin-film transistor as shown in FIGS. 10A–10E and discussed in detail below.

Figure 5A:
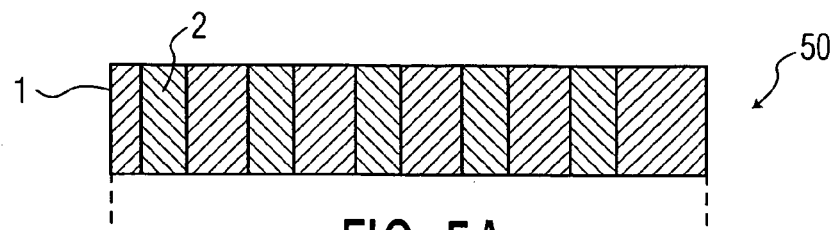
FIG. 5A is a cross-sectional view of a co-polymer cylinder structure having an insulator and an organic semiconductor vertically layered, with cylindrical structures of organic semiconductor surrounded in a matrix of insulator, according to the present invention.
Figure 5B:
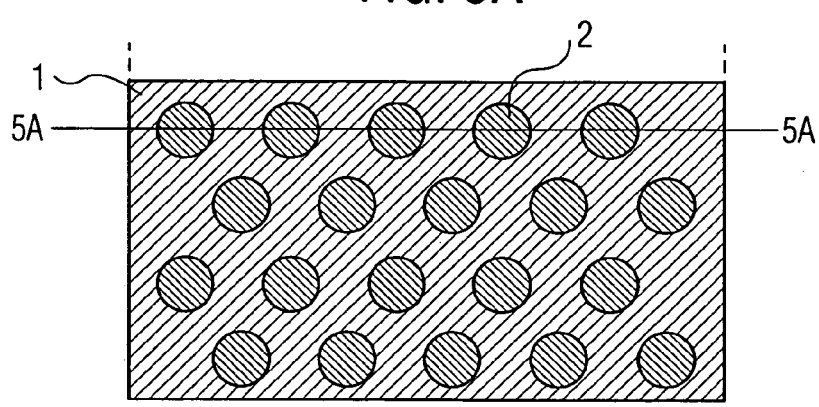
FIG. 5B is a top view of the vertical cylinder structure shown in FIG. 5A.

FIG. 5A (cross-section) and 5B (top view) show a co-polymer cylinder structure 50 formed according to the present invention. FIGS. 5A and 5B show thin-film co-polymer cylinder structure 50 self-assembled from polymers comprised of the insulator 1 and the organic semiconductor 2. As best illustrated in FIG. 5A, which is a cross-section taken along the line 5A—5A of FIG. 5B, insulator 1 and organic semiconductor 2 of cylinder structure 50 are vertically layered, with cylindrical structures of organic semiconductor 2 surrounded in a matrix of insulator 1.

Vertical cylinder structure 50 can be formed using processes as outlined above, in connection with lamella structure 30, and as described in more detail by authors M. Lazzari and M. López-Quintela. Upon formation, vertical cylinder structure 50 can be incorporated into a thin-film transistor. Vertical cylinder structure 50 of FIGS. 5A and 5B can be used, for example, to form an improved multi-gate thin-film transistor as shown in FIGS. 11A–11F and discussed in detail below.

Figure 6A:
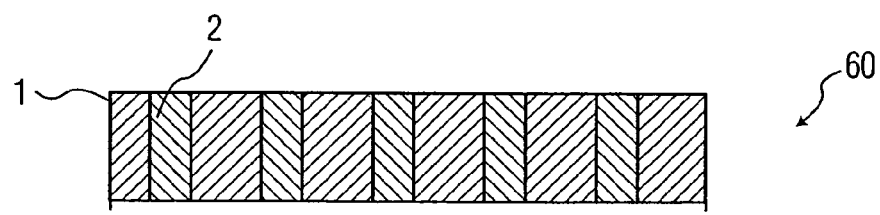
FIG. 6A is a cross-sectional view of a co-polymer lamella structure having an insulator and an organic semiconductor vertically layered, with alternating lamellae of the insulator and the organic semiconductor, according to the present invention.
Figure 6B:
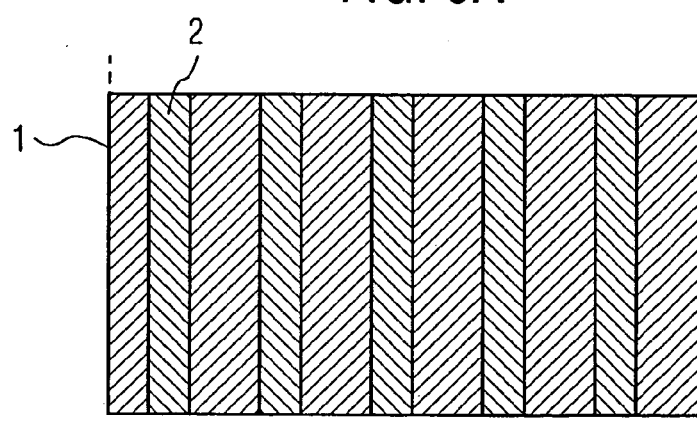
FIG. 6B is a top view of the vertical lamella structure shown in FIG. 6A.

FIGS. 6A (cross-section) and 6B (top view) show a co-polymer lamella structure 60 formed according to the present invention. FIGS. 6A and 6B show thin-film co-polymer lamella structure 60 self-assembled from polymers comprised of the insulator 1 and the organic semiconductor 2. As best illustrated in FIG. 6A, insulator 1 and organic semiconductor 2 of lamella structure 30 are layered in a vertical orientation, with alternating lamellae of insulator 1 and semiconductor 2.

Vertical lamella structure 60 can be formed using processes as outlined above, in connection with lamella structure 30, and as described in more detail by authors M. Lazzari and M. López-Quintela. Upon formation, vertical lamella structure 60 can be incorporated into a thin-film transistor. Vertical lamella structure 60 of FIGS. 6A and 6B can be used, for example, to form an improved multi-gate thin-film transistor as shown in FIGS. 12A–12F and discussed in detail below.

B. General Multi-Gate Semiconductor Transistors

As discussed above, multi-gate semiconductor structures offer several advantages in comparison to single-gate structures. Therefore, the inventors recognized the desirability of using the self-assembling co-polymer combination insulator and organic semiconductor structures of the present invention to manufacture multi-gate semiconductor structures. FIGS. 7A (cross-section) and 7B (side view) illustrate a single-gate transistor structure for comparison purposes. As best illustrated in FIG. 7A, which is a cross-section taken along the line 7A—7A of FIG. 7B, cylindrical organic semiconductor 2 is surrounded in a matrix of insulator 1. The single gate electrode 6 is formed on top of insulator 1 (although gate electrode 6 could be formed on any portion of insulator 1, as dictated by the application). The source electrode 4 and the drain electrode 5 are each formed at opposite ends of cylindrical organic semiconductor 2.

Figure 8B:
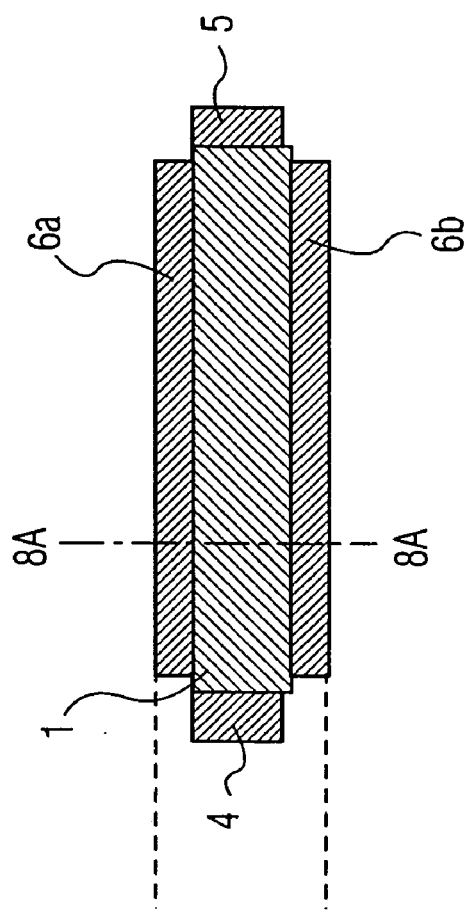
FIG. 8B is a side view of the dual-gate transistor structure shown in FIG. 8A.
Figure 8A:
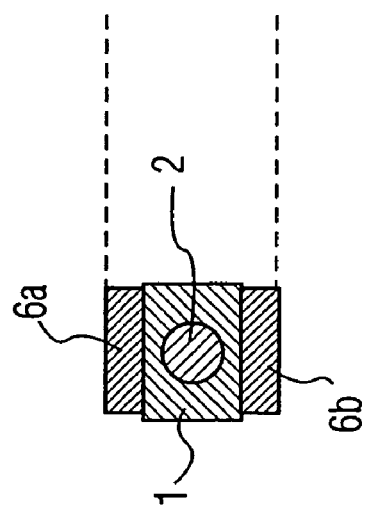
FIG. 8A is a cross-sectional view of a dual-gate transistor structure formed according to the present invention.

FIGS. 8A (cross-section) and 8B (side view) illustrate a dual-gate transistor structure. Again, as best illustrated in FIG. 8A, which is a cross-section taken along the line 8A—8A of FIG. 8B, cylindrical organic semiconductor 2 is surrounded in a matrix of insulator 1. Like the single-gate transistor structure of FIGS. 7A and 7B, the source electrode 4 and the drain electrode 5 are each formed at opposite ends of cylindrical organic semiconductor 2. Unlike the single-gate transistor structure of FIGS. 7A and 7B, however, the dual-gate transistor structure of FIGS. 8A and 8B has a first gate electrode 6a formed adjacent a first portion of insulator 1 and a second gate electrode 6b formed adjacent a second portion of insulator 1.

FIGS. 9A (cross-section) and 9B (side view) illustrate a tri-gate transistor structure. Again, as best illustrated in FIG. 9A, which is a cross-section taken along the line 9A—9A of FIG. 9B, cylindrical organic semiconductor 2 is surrounded in a matrix of insulator 1. Like the single and dual-gate transistor structures discussed above, the source electrode 4 and the drain electrode 5 are each formed at opposite ends of cylindrical organic semiconductor 2. Unlike the prior structures, however, the tri-gate transistor structure of FIGS. 9A and 9B has a first gate electrode 6a formed adjacent a first portion (e.g., the top) of insulator 1 and two additional gate electrodes 6c formed adjacent other portions (e.g., either side) of insulator 1.

Although not illustrated, a transistor structure having four gate electrodes is also possible. A first gate electrode is formed on top of the insulator 1. A second gate electrode is formed on the bottom of the insulator 1. And two additional gate electrodes are formed on either side of insulator 1.

C. Specific Multi-Gate Semiconductor Transistors

Figure 10A:
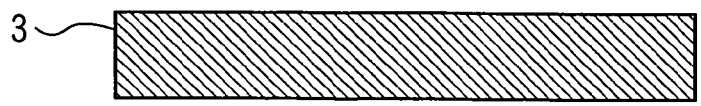
FIGS. 10A, 10B, 10C, 10D, and 10E illustrate in cross-section the various structures formed during the steps of the process used to incorporate the parallel cylinder structure shown in FIGS. 4A and 4B into a multi-gate thin-film transistor structure according to the present invention.

Described in detail below are several embodiments of the processes that may be used to form multi-gate thin-film transistors, using the various self-assembling co-polymer combination insulator and organic semiconductor structures described above, according to the present invention. Turning first to the parallel cylinder structure 40 illustrated in FIGS. 4A and 4B, such structure 40 is incorporated into a multi-gate thin-film transistor structure via the process illustrated in FIGS. 10A–10E. The process begins by providing a substrate 3 as shown in FIG. 10A.

Figure 10B:
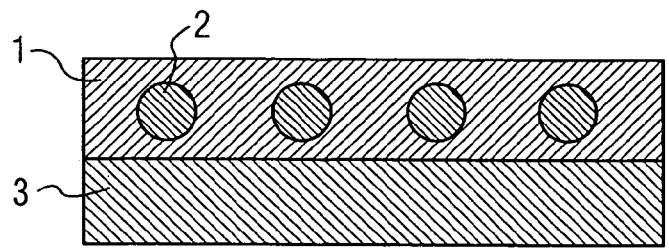
Figure 10C:
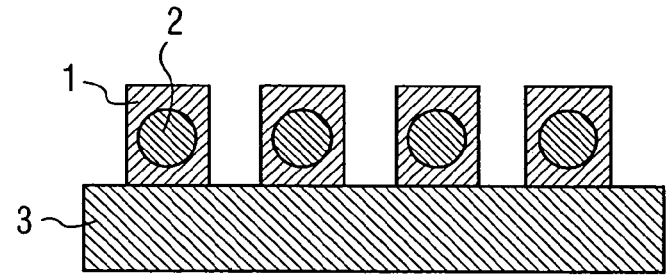
Figure 10D:
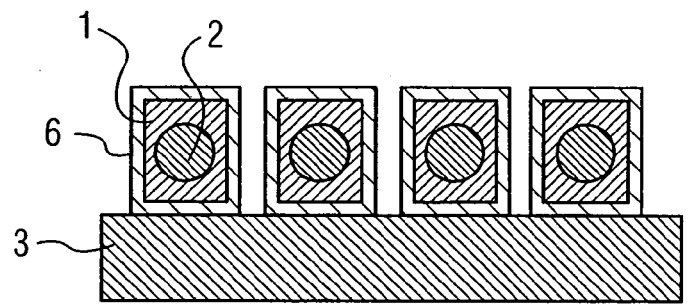
Figure 10E:
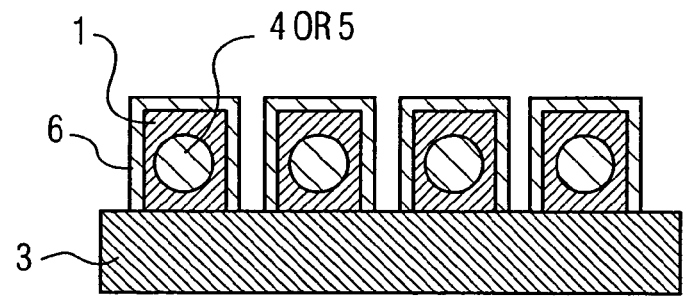

Next, as shown in FIG. 10B, the polymers are deposited on substrate 3 and cylinders of the organic semiconductor 2 are self-assembled in the direction parallel to the thin film within the matrix of the insulator 1. Compare FIG. 10B with the self-assembling co-polymer combination insulator and organic semiconductor structure of FIG. 4A. The next processing step is to separate the individual cylinders by removing parts of insulator 1 between the cylinders of organic semiconductor 2. The structure resulting after this step is shown in FIG. 10C. Then the gate electrodes 6 are formed around the insulator 1, as illustrated in FIG. 10D. Gate electrodes 6 may be separated for applications in which individual control is necessary. Finally, the source electrode 4 and the drain electrode 5 are formed at the ends of organic semiconductors 2, as shown in FIG. 10E.

Figure 11A:
FIGS. 11A, 11B, 11C, 11D, and 11E illustrate in cross-section the various structures formed during the steps of the process used to incorporate the vertical cylinder structure shown in FIGS. 5A and 5B into a multi-gate thin-film transistor structure according to the present invention.

In another embodiment, the process steps used to form a multi-gate transistor are illustrated sequentially in FIGS. 11A–11E. These process steps incorporate the vertical cylinder structure 50 illustrated in FIGS. 5A and 5B. The process begins by providing a substrate 3 as shown in FIG. 11A.

Figure 11B:
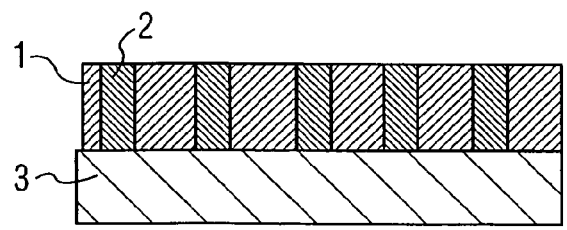

Next, as shown in FIG. 11B, the polymers are deposited on substrate 3, which has patterned source (or drain) electrodes, and cylinders of the organic semiconductor 2 are self-assembled in the direction perpendicular to the thin film within the matrix of the insulator 1 preferentially on the electrodes. Compare FIG. 11B with the self-assembling co-polymer combination insulator and organic semiconductor structure of FIG. 5A. The location preference may be controlled in various ways, such as preferable affinity between the electrodes and organic semiconductors 2 which may naturally occur; by surface treatment of the electrodes; by a stress field induced through geometrical differences; by an electrical field applied via the electrodes; by applying a magnetic field; or by any other suitable mechanism as would known to an artisan.

Figure 11C:
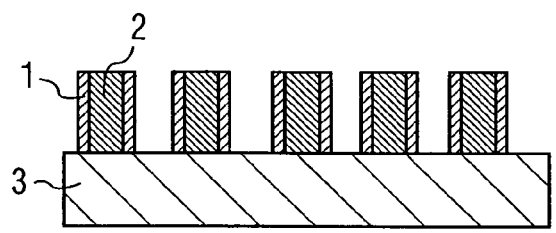
Figure 11D:
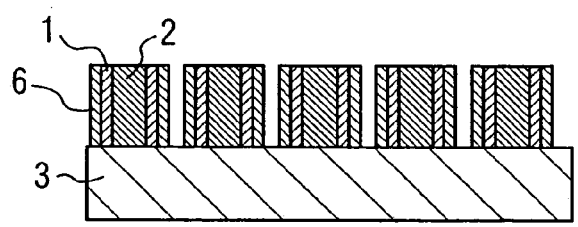
Figure 11E:
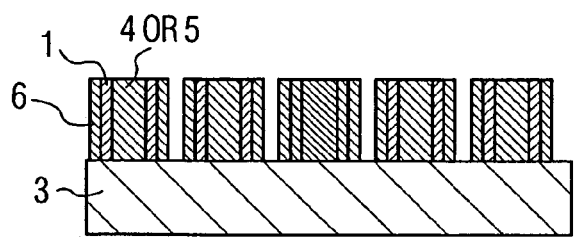
Figure 11F:
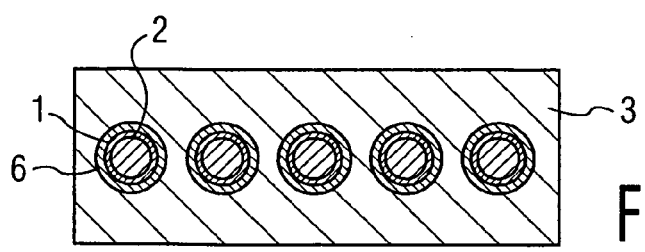
FIG. 11F is a top view of the structure shown in FIG. 11E.

The next processing step is to separate the individual cylinders by removing parts of insulator 1 between the cylinders of organic semiconductor 2. The structure resulting after this step is shown in FIG. 11C. Then the gate electrodes 6 are formed around the insulator 1, as illustrated in FIG. 11D. Gate electrodes 6 may be separated for applications in which individual control is necessary. Finally, the source electrode 4 and the drain electrode 5 are formed at the ends of organic semiconductors 2, as shown in FIG. 11E. FIG. 11F is a top view of the final structure illustrated in cross-section by FIG. 11E.

Figure 12A:
FIGS. 12A, 12B, 12C, 12D, and 12E illustrate in cross-section the various structures formed during the steps of the process used to incorporate the vertical lamella structure shown in FIGS. 6A and 6B into a multi-gate thin-film transistor structure according to the present invention.

In yet another embodiment, the process steps used to form a multi-gate transistor are illustrated sequentially in FIGS. 12A–12E. These process steps incorporate the vertical lamella structure 60 illustrated in FIGS. 6A and 6B. The process begins by providing a substrate 3 as shown in FIG. 12A.

Figure 12B:
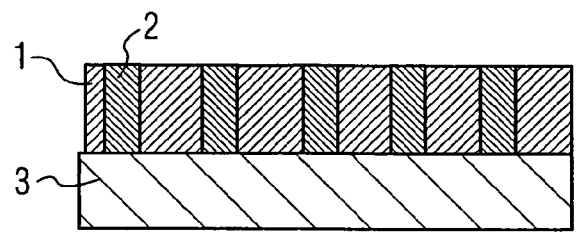

Next, as shown in FIG. 12B, the polymers are deposited on substrate 3 and the vertically self-assembled lamella structure is formed. The structure includes the insulator 1 and the organic semiconductor 2 layered in a vertical orientation, with alternating lamellae of insulator 1 and semiconductor 2. Compare FIG. 12B with the self-assembling co-polymer combination insulator and organic semiconductor structure of FIG. 6A.

Figure 12C:
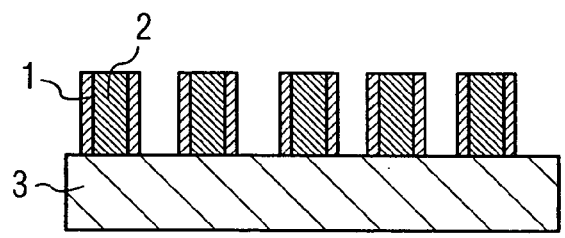
Figure 12D:
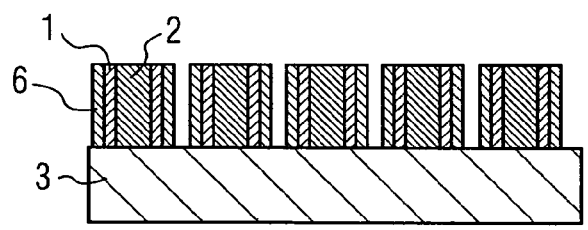
Figure 12E:
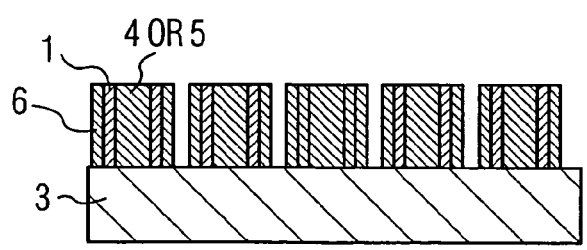
Figure 12F:
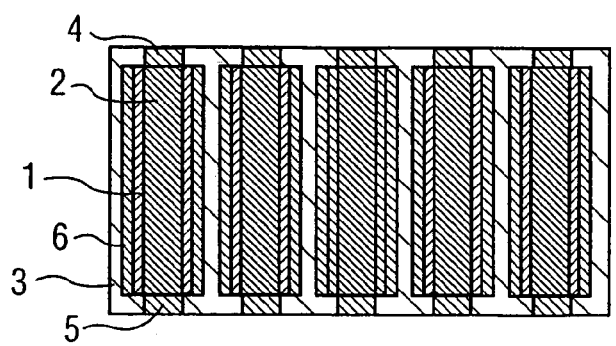
FIG. 12F is a top view of the structure shown in FIG. 12E.

The next processing step is to separate the individual organic semiconductors 2, which are sandwiched by insulators 1, by removing parts of insulator 1 between organic semiconductors 2. The structure resulting after this step is shown in FIG. 12C. Then the gate electrodes 6 are formed around the insulator 1, as illustrated in FIG. 12D. Gate electrodes 6 may be separated for applications in which individual control is necessary. Finally, the source electrode 4 and the drain electrode 5 are formed at the ends of organic semiconductors 2, as shown in FIG. 12E. FIG. 12F is a top view of the final structure illustrated in cross-section by FIG. 12E.

By self-assembling polymers of the insulator and organic semiconductor into a co-polymer structure, both layers in a thin-film transistor can be formed simultaneously. Further, the interface between the insulator and semiconductor is substantially free of imperfection or contamination. Still further, the process steps required to produce a thin-film transistor are reduced and simplified relative to conventional manufacturing processes. Finally, many of the obstacles previously encountered by attempts to fabricate multi-gate thin-film transistors are overcome by using self-assembling co-polymers according to the present invention.

As mentioned above, among the organic semiconductors suitable for use in the present invention are carbon nanotubes. Although the present invention encompasses both multi-walled and single-walled carbon nanotubes, the focus of the following discussion is on the latter. Single-walled nanotubes or SWNTs (sometimes called "buckytubes") are hollow molecules of pure carbon linked together in an hexagonally bonded network to form a hollow polymer cylinder. The tube is seamless, with either open or capped ends, and is free of property-degrading flaws in the nanotube structure. The diameter of an individual SWNT is 0.7 to 2 nm, typically about 1.0 nm, which is about 100,000 times thinner than a human hair, about half the diameter of DNA, and about $1/10,000^{th}$ the diameter of graphite fibers. Individual tubes are about 100–1,000 nm in length, hundreds of times their diameters, giving SWNTs a very high aspect ratio. Specifically, the aspect ratio of a SWNT is around 100–1,000, compared with about 1 for carbon black particles. The special nature of carbon combines with the molecular structure of the SWNT to give SWNTs exceptionally high material properties such as electrical and thermal conductivity, strength, stiffness, and toughness.

SWNTs can be reacted and manipulated using the rich chemistry of carbon. Thus, a SWNT gives the user an opportunity to modify the structure and to optimize solubility and dispersion. The material characteristics of the SWNT give the SWNT potential in numerous applications, including use as filler in thermoplastics and thermosets. In fact, SWNTs naturally form a morphology that is ideal for conductive filler applications. SWNTs self-assemble into "ropes" of tens to hundreds of aligned tubes, running side by side, branching and recombining. When examined by electron microscopy, it is exceedingly difficult to find the end of any of these ropes. Thus, ropes form naturally occurring, long, conductive pathways that can be exploited in making electrically conductive filled composites.

Additional information about SWNTs can be obtained from Carbon Nanotechnologies, Incorporated of Houston, Tex. (www.cnanotech.com). More generally, the United States government provides information as part of its National Nanotechnology Initiative ("NNI"). A discussion of the emerging field of nanotechnology, the science of manipulating materials on an atomic or molecular scale, can be found at www.nano.gov.

Although the invention is illustrated and described above with reference to specific embodiments, the invention is not intended to be limited to the details shown. Rather, various modifications may be made in the details within the scope and range of equivalents of the claims and without departing from the invention.

What is claimed:

1. A process of manufacturing a thin-film organic semiconductor device, the process comprising:
   (a) providing a substrate;
   (b) applying to the substrate an insulator layer formed of a first polymer and an organic semiconductor layer formed of a second polymer, wherein the polymers self-assemble into a well-ordered co-polymer structure with the semiconductor layer positioned adjacent the insulator layer; and
   (c) removing parts of the insulator between the organic semiconductor layer, thereby separating the layers of organic semiconductor.

2. The process of claim 1, wherein the co-polymer is a block co-polymer.

3. The process of claim 1, wherein the organic semiconductor layer comprises carbon-based nanotubes.

4. The process of claim 1, wherein an interface between the insulator layer and the organic semiconductor layer is substantially free of contamination.

5. The process of claim 1, further comprising the step of forming at least one gate electrode on an exposed surface of the insulator layer.

6. The process of claim 5, further comprising the step of forming a source electrode and a drain electrode at the ends of the organic semiconductor layer.

7. The process of claim 1, further comprising the step of forming at least two gate electrodes on an exposed surface of the insulator layer.

8. The process of claim 7, further comprising the step of separating the at least two gate electrodes.

* * * * *